United States Patent
Era

(10) Patent No.: US 6,676,749 B2
(45) Date of Patent: Jan. 13, 2004

(54) METHOD FOR PREPARING LAYERED PEROVSKITE COMPOUND THIN FILM WITH ORGANIC AMMONIUM LAYERS AND INORGANIC LAYERS

(75) Inventor: Masanao Era, Saga (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 10/030,094
(22) PCT Filed: Dec. 15, 2000
(86) PCT No.: PCT/JP00/08943
§ 371 (c)(1),
(2), (4) Date: Apr. 9, 2002
(87) PCT Pub. No.: WO01/87896
PCT Pub. Date: Nov. 22, 2001

(65) Prior Publication Data
US 2002/0124790 A1 Sep. 12, 2002

(30) Foreign Application Priority Data
May 15, 2000 (JP) ......................................... 2000-147507

(51) Int. Cl.[7] .......................... C30B 21/02; C30B 28/06; C30B 7/00
(52) U.S. Cl. ........................................................ 117/68
(58) Field of Search ............................... 505/1; 117/64, 117/68, 70, 925, 940

(56) References Cited

U.S. PATENT DOCUMENTS 5,871,579 A 2/1999 Liang et al.

FOREIGN PATENT DOCUMENTS

JP 10-316685 2/1998
JP 11-140656 5/1999

OTHER PUBLICATIONS

Quantum Effects and Related Physical Phenomena—JST Abstracts—1999.
Masanao ERA et al.; The Chemical Society of Japan, Chemistry Industry 1997; pp. 1235–12336 —1997.
Masanao ERA, Self–organized construction of layered perovskite organic/inorganic superlattice materials with functionalized ammonium molecules as organic layer and their application to emissive device, (with English translation), Quamtum Effects and Related Physical Phenomena, Abstracts, Dec. 21 and 22, 1999.
Iwanami Shoten, Physics and Chemistry Dictionary –5th Edition, p. 123 "Langmuir–Blodgett technique" (with English translation).

Primary Examiner—Felisa Hiteshew
(74) Attorney, Agent, or Firm—Westerman, Hattori, Daniels & Adrian, LLP

(57) ABSTRACT

A method for preparing a layered perovskite compound thin film having a film thickness and structure controlled at a monomolecular layer and capable of combining various layered perovskite compounds at the level of a monomolecular layer. The method a superlattice structure represented by the general formula $A_2MX_4$ where A is an organic ammonium molecule, M is a group 4 element or transition metal and X is halogen layers of organic ammonium molecule "A" and layers of inorganic halide "$MX_4$" are alternately stacked. A monomolecular film of an organic amine hydrohalic acid salt having a long-chain alkyl group is spread out on the surface of a water solution of an inorganic halide $MX_2$ and a methylamine hydrohalic acid salt. By leaving the monomolecular film, a layered perovskite compound monomolecular film is formed on the surface of the water solution. This layered perovskite monomolecular film is transferred and stacked onto a substrate on a one by one basis by using the Langmuir-Blodgett method.

11 Claims, 6 Drawing Sheets

METHOD FOR PREPARING LAYERED PEROVSKITE COMPOUND THIN FILM WITH ORGANIC AMMONIUM LAYERS AND INORGANIC LAYERS

TECHNICAL FIELD

The present invention relates to a method for preparing a layered perovskite compound thin film with organic ammonium layers and inorganic layers, and a layered perovskite compound thin film with organic ammonium layers and inorganic layers prepared thereby in which the organic ammonium molecule contains a functional chromophore.

BACKGROUND ART

It is known that a layered perovskite compound has a superlattice structure in which an organic layer and an inorganic layer are alternately stacked, and exhibits various interesting properties useful for low-dimensional semiconductors, magnetic bodies, luminous bodies or the like, depending on the type of inorganic halide layer. In addition, it is suggested that the layered perovskite compound has the potential of providing new functional materials capable of bringing out combined functionalities of organic layers and inorganic layers (M. Era, K. Maeda, and T. Tsutsui, Chemistry Letters, 1235–1236, 1997).

One of known layered perovskite compounds has a superlattice structure which is represented by the general formula $A_2MX_4$ where A is an organic ammonium molecule, M is a group 4 element or transition metal and X is halogen (Cl, Br, I), and in which a layer of organic ammonium molecule "A" and a layer of inorganic halide "$MX_4$" are alternately stacked (see FIG. 10 showing a schematic diagram thereof). Further, another known layered perovskite compound has a superlattice structure which is represented by the general formula $A_2MX_4$, where A is organic ammonium ions, M is divalent rare earth metal cations and X is halogen (Cl, Br, I), and in which a layer of organic ammonium molecule "A" and a layer of inorganic halide "$MX_4$" are alternately stacked (Japanese Patent Laid-Open Publication No. Hei 10-316685).

A conventional method for preparing a thin film from such layered perovskite compounds includes one method (a casting method or spin-coating method) in which a crystal of a layered perovskite compound or a mixture of an organic amine hydrohalic acid salt and an inorganic halide $MX_2$ is dissolved in an organic solvent and then a thin film is formed from the resulting solution, and another method (a two-source deposition method) in which an organic amine hydrohalic acid salt and an inorganic halide $MX_2$ are deposited simultaneously in vacuo.

Heretofore, as a method for depositing monomolecular films, there has been known the Langmuir-Blodgett method (LB method) used for manufacturing organic thin films. Japanese Patent Laid-Open Publication No. Hei 11-140656 disclosed a method for manufacturing an inorganic thin film in which monomolecular films are accumulated with controlling the composition and arrangement of metal elements by using the Langmuir-Blodgett method to form an organic thin film, and then the organic component of the organic thin film is decomposed and removed to form an inorganic thin film. However, such a method has not been successfully used for preparing layered perovskite compound thin films.

As shown in FIG. 9, the Langmuir-Blodgett method is a technique for preparing a thin film having a film thickness and structure controlled at the level of a monomolecular layer by forming a monomolecular film of amphipathic molecules on the water and transferring it onto a substrate (see "Physics and Chemistry Dictionary-5th Edition" published by Iwanami Shoten).

DISCLOSURE OF INVENTION (Problem to be Solved by the Invention)

For using the above layered perovskite compound with organic ammonium layers and inorganic layers as device materials, it is a critical task to control a film thickness and structure stringently at the level of a monomolecular layer. Further, if such layered perovskite compounds can be combinedly formed at the level of a monomolecular layer, it would open the way to develop various materials having higher performance. However, the conventional techniques for preparing layered perovskite compounds have not been able to prepare such a thin film having a film thickness and structure controlled at the level of a monomolecular layer.

Therefore, it is an object of the present invention to provide a novel method for preparing a layered perovskite compound thin film with organic ammonium layers and inorganic layers which has a film thickness and structure controlled at the level of a monomolecular layer, and to provide a layered perovskite compound thin film with organic ammonium layers and inorganic layers which has a novel function useful for devices, through this method.

(Means for Solving the Problem)

The inventor has found a method for forming a monomolecular film of an organic-inorganic layered perovskite compound on the surface of a water solution. Based on this method and applying the Langmuir-Blodgett method, the inventor has made it possible to prepare a layered perovskite organic-inorganic superlattice material having a film thickness and structure controlled at the level of a monomolecular layer. Further, in combination with this method, the inventor has achieved to introduce a chromophore into the organic layers so as to allow the layered perovskite organic-inorganic superlattice material to be applied to electroluminescence (EL) devices.

More specifically, according to a first aspect of the present invention, there is provided a method for preparing a layered perovskite compound thin film with organic ammonium layers and inorganic layers which has a superlattice structure represented by the general formula $A_2MX_4$ where "A" is an organic ammonium molecule, "M" is a group 4 element or transition metal and "X" is halogen (Cl, Br, I), and in which a layer of organic ammonium molecule "A" and a layer of inorganic halide "$MX_4$" are alternately stacked, characterized in that an organic solvent solution having dissolved therein an organic ammonium molecule or a mixture of an organic ammonium molecule and an inorganic halide is dropped onto to the surface of a water solution having dissolved therein a water-soluble organic ammonium molecule and an inorganic halide to form a monomolecular film of an organic amine hydrohalic acid salt having a long-chain alkyl group and simultaneously to react the formed monomolecular film with the inorganic halide in the water solution so as to form a monomolecular film of a layered perovskite with organic ammonium layers and inorganic layers on the surface of the water solution, and then the formed monomolecular film is transferred onto a substrate by using the Langmuir-Blodgett method.

The group 4 element herein is Ge, Sn or Pb, and the transition metal is Cr, Mn, Fe, Co, Ni, Cu, Zn or Cd. The inorganic halide is a compound represented by the chemical formula $MX_2$ where M is a group 4 element or transition metal and X is halogen (Cl, Br, I). The substrate for the monomolecular film to be transferred thereon may be selected from the group consisting of a silicon substrate, a metal plate, a glass plate, a fused quartz substrate, and an inorganic compound single crystal substrate.

In the method according to the first aspect of the present invention, the organic ammonium molecule to be dissolved in the water solution may be a water-soluble alkylamine hydrohalic acid salt $C_nH_{2n+1}NH_3X$, and the organic ammonium molecule to be dissolved in the organic solvent solution may contain a non-water-soluble alkylamine hydrohalic acid salt $C_nH_{2n+1}NH_3X$. The water-soluble alkylamine hydrohalic acid salt $C_nH_{2n+1}NH_3X$ can facilitate the formation of the layered perovskite monomolecular film on the surface of the water solution.

Further, the non-water-soluble alkylamine hydrohalic acid salt $C_nH_{2n+1}NH_3X$ to be dissolved in the organic solvent solution may be a dococylamine hydrohalic acid salt $C_{22}H_{45}NH_3X$. The dococylamine hydrohalic acid salt $C_{22}H_{45}NH_3X$ having a long-chain alkyl group allows a stable monomolecular film to be formed on the water solution.

In the method according to the first aspect of the present invention, the organic solvent may be chloroform or a mixture of chloroform and dimethylformamide. The dimethylformamide added to the solvent allows the hardly-soluble inorganic halide to be sufficiently dissolved in the solvent solution.

Further, in the method according to the first aspect of the present invention, the organic ammonium molecule "A" may be an organic ammonium containing a functional chromophore. The organic ammonium containing the functional chromophore allows the layered perovskite compound thin film with organic ammonium layers and inorganic layers to be provided with the organic layers having a useful function.

In this case, the organic ammonium molecule to be dissolved in the organic solvent may be an organic ammonium containing a non-water-soluble functional chromophore. The chromophore devoid of any electrically insulative alkyl chain allows the layered perovskite compound thin film to have high conductivity. This advantageously provides an electronic function suitable for EL devices and other electronic devices.

Further, the functional chromophore may be azobenzene chromophore or salicyliden aniline chromophore. The azobenzene chromophore or salicyliden aniline chromophore exhibiting a photochromic reaction allows the property of the layered perovskite to be optically controlled.

According to a second aspect of the present invention, there is provided a method for a layered perovskite compound thin film with organic ammonium layers and inorganic layers, characterized in that a plurality of layered perovskite compound thin films are prepared by the method according to the first aspect of the present invention, wherein at least two of the layered perovskite compound thin films are different in at least either one of the kinds of the inorganic layer and organic ammonium layer, and wherein the formed layered perovskite compound thin films are combinedly stacked in increments of a monomolecular layer. There are various layered perovskites capable of exhibiting an optical, magnetic or semiconductive characteristic. Thus, according to this method, a thin film having a new functionality can be prepared by combining such layered perovskites at the level of a monomolecular layer.

According to a third aspect of the present invention, there is provided a layered perovskite compound thin film with organic ammonium layers and inorganic layers prepared by the method according to either one of the first and second aspects of the present invention, which has a superlattice structure represented by the general formula $A_2MX_4$ where "A" is an organic ammonium molecule, "M" is a group 4 element or transition metal and "X" is halogen (Cl, Br, I), and in which a layer of organic ammonium molecule "A" and a layer of inorganic halide "$MX_4$" are superimposed alternately, wherein the organic ammonium molecule "A" is an organic ammonium containing a functional chromophore. When forming a composite layered perovskite compound thin film, the property or function of the inorganic or organic layer in each of the layered perovskites can be combined at the level of a monomolecular layer.

In the layered perovskite compound thin film with organic ammonium layers and inorganic layers according to the third aspect of the present invention, the functional chromophore may be azobenzene chromophore or salicyliden aniline chromophore. The photochromic chromophore exhibiting a certain photochromic reaction depending on lights having different wavelengths allows the property of the particular layered perovskite in the composite layered perovskite compound thin film to be optically controlled.

Further, the inorganic halide may be $PbBr_2$ or $CuBr_2$. The $PbBr_2$-based layered perovskite exhibits semiconductive properties, and the $CuBr_2$-based layered perovskite exhibits ferromagnetic properties

BEST MODE FOR CARRYING OUT THE INVENTION

Figure 1:
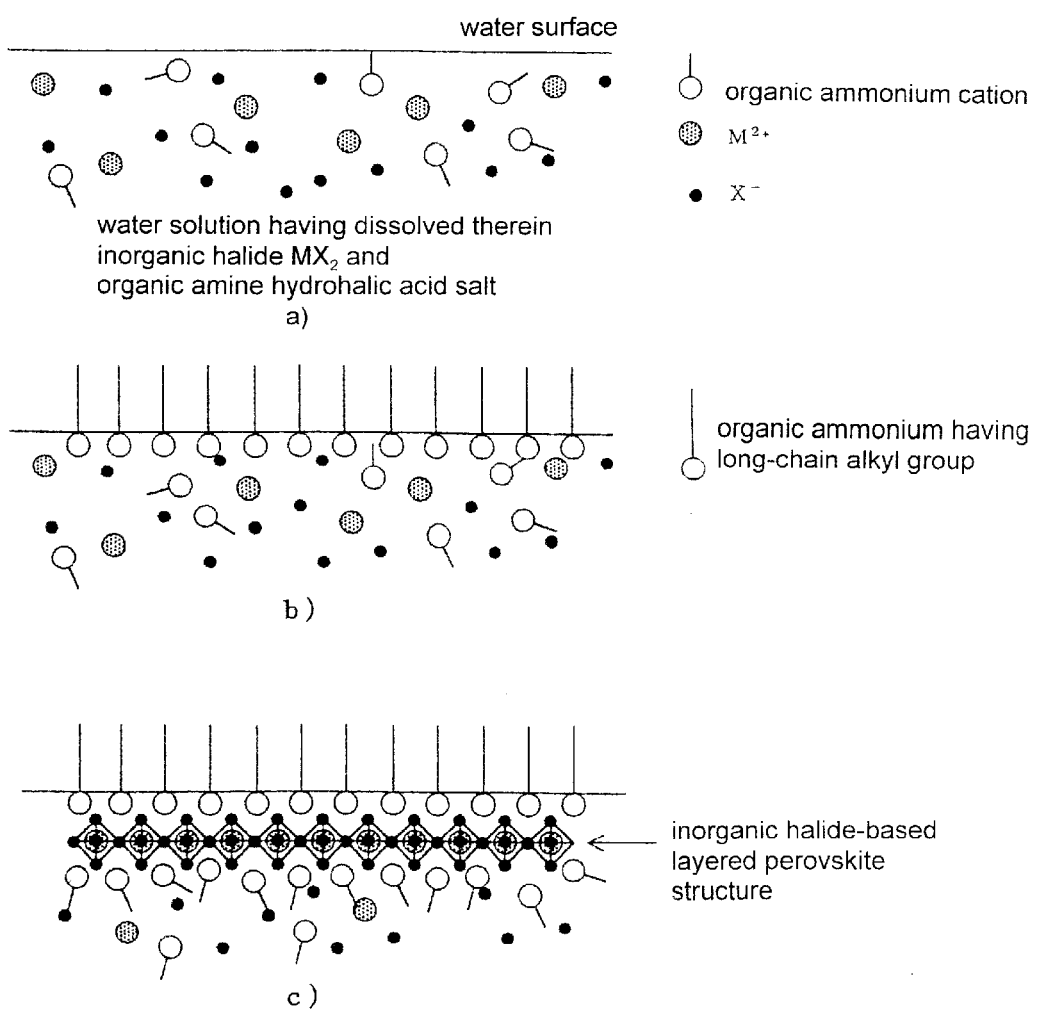
FIG. 1 is an explanatory conceptual diagram of a principle of forming a monomolecular film of an organic amine hydrohalic acid salt having a long-chain alkyl group on the surface of a water solution.

With reference to FIG. 1, a method according to the present invention for preparing a layered perovskite thin film in combination with the Langmuir-Blodgett method will now be described in detail. A commercially available LB film depositing apparatus can be used for preparing an LB film. For a start, as shown in FIG. 1 (a), a water solution having dissolved therein an inorganic halide $MX_2$ and alkylamine hydrohalic acid salt $C_nH_{2n+1}NH_3X$ as an organic ammonium molecule which constitute perovskite is prepared.

Then, as shown in FIG. 1 (b), a solution formed by dissolving only a non-water-soluble organic amine hydrohalic acid salt in an organic solvent, or a solution formed by dissolving a non-water-soluble organic amine hydrohalic acid salt, a water-soluble organic amine hydrohalic acid salt (e.g. methylamine hydrohalic acid salt) and an inorganic halide $MX_2$ in an organic solvent is prepared. Then, this solution is dropped onto the surface of the water solution and the surface area of the dropped solution on the surface of the water solution is narrowed to form a monomolecular film of the non-water-soluble organic amine hydrohalic acid on the water solution. By adding the inorganic halide $MX_2$, a desired layered perovskite thin film can be more reliably formed.

Then, as shown in FIG. (c), the monomolecular film is left on the surface of the water solution to react the monomolecular with the inorganic halide in the water solution so as to form a layered perovskite compound monomolecular film. This reaction is represented by the reaction formula $2RNH_3X+MX_2 \rightarrow (RNH_3)_2MX_4$.

Then, the formed layered perovskite monomolecular film is transferred and stacked on a one by one basis through the Langmuir-Blodgett method to provide a layered perovskite compound thin film having a film thickness and structure controlled at the level of a monomolecular layer.

EXAMPLE

Example 1

1.5 liters of water solution (concentration: $10^{-4}$ mol/l) having dissolved therein lead bromide as an inorganic halide $MX_2$ and methylamine hydrobromide as an organic ammonium molecule was poured into a vessel and was kept in a stable state. Then, 2 ml of organic solvent solution (concentration: $10^{-4}$ mol/l) having dissolved therein dococylamine hydrobromide with chloroform as an organic solvent was dropped onto the surface of the water solution.

The organic solvent was completely evaporated just after the dropping. After the vaporization, when the monomolecular film was compressed to increase its surface pressure up to 30 $mN^{-1}$, an organic-inorganic layered perovskite compound monolayer film of dococyl ammonium-lead bromide represented by the molecular formula $(C_{22}H_{45}NH_3)_2PbBr_4$ was formed on the surface of the water solution. A fused quartz subjected to a hydrophobic treatment with hexamethyldisilazane was used as a substrate. The formed monolayer film was transferred and stacked onto the substrate on a one by one basis so as to form a multi-layer organic-inorganic layered perovskite compound film.

Figure 2:
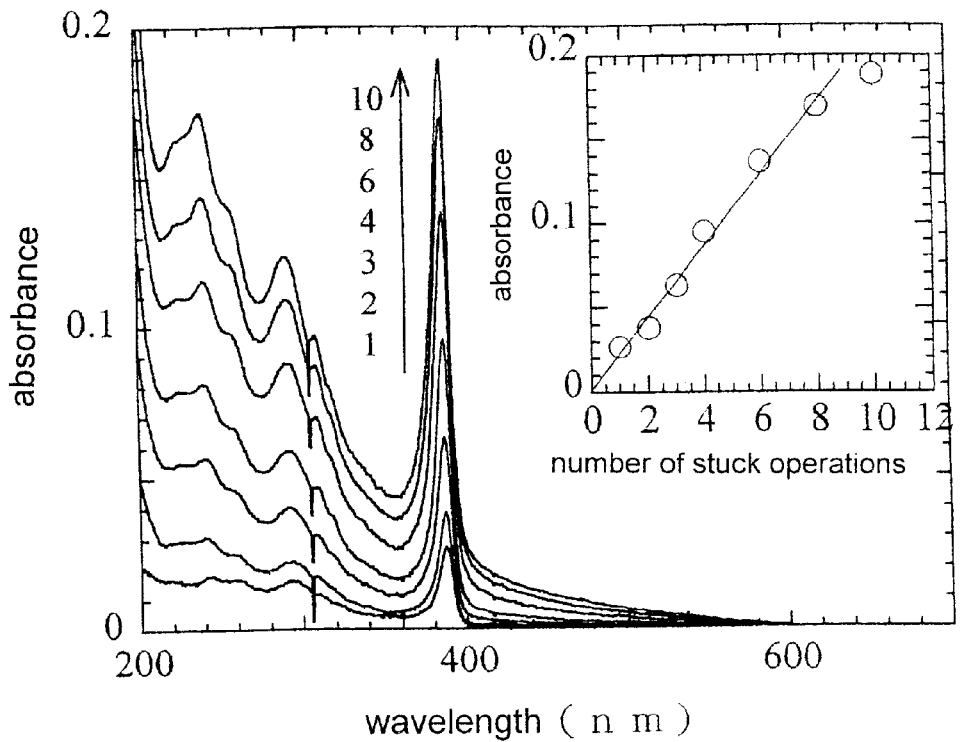
FIG. 2 is a graph showing an absorption spectrum of a layered perovskite compound thin film prepared in an example 1.

FIG. 2 shows an absorption spectrum of the lead bromide-based layered perovskite $(C_{22}H45NH_3)_2PbBr_4$ thin film prepared in this example. The thin film exhibits the sharp exciton absorption characteristic of the lead bromide-based layered perovskite in the vicinity of 390 nm wavelength. This proves that a lead bromide-based layered perovskite compound $PbBr_4$ thin film is obtained.

From the absorbance of the exciton absorption, it was also verified that the thin film was formed by stacking one monomolecular layer for each stack operation. Further, it was verified that this layered perovskite monomolecular layer could be stacked to form a multi-layer so as to provide a desired thin film having a film thickness controlled at the level of a monomolecular layer, because the exciton absorption was increased in proportion to the number of the stack operations.

Example 2

An organic solvent containing about 10 volume % of dimethylformamide added in chloroform was used as a substitute for the chloroform used as an organic solvent in the example 1. Both of dococylamine hydrobromide $C_{22}H_{45}NH_3Br$ and lead bromide are dissolved in the organic solvent to form an organic solvent solution to be used.

Figure 3:
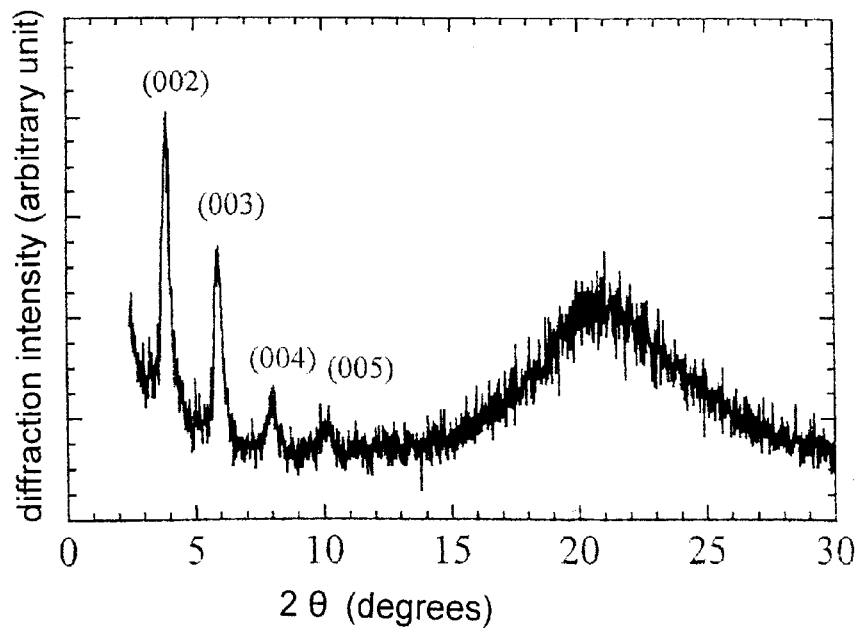
FIG. 3 is a graph showing an X-ray diffraction profile of a layered perovskite compound thin film prepared in an example 2.
Figure 4:
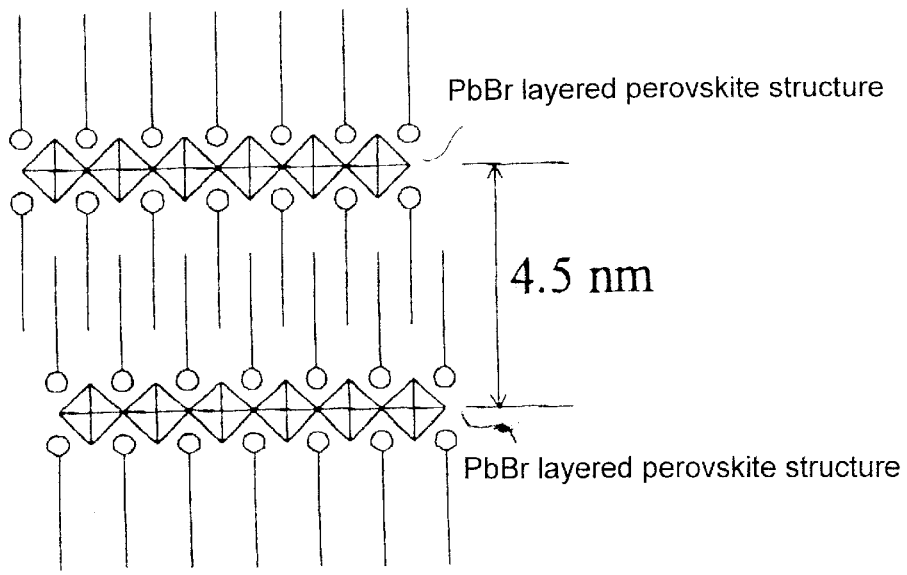
FIG. 4 is a conceptual diagram showing the layer structure of an organic ammonium-containing PbBr-based layered perovskite.

In this manner, a desired $(C_{22}H45NH_3)_2PbBr_4$ layered perovskite thin film as in the example 1 could be prepared with excellent reproducibility. FIG. 3 shows an X-ray diffraction profile of a thin film formed through ten stack operations. A diffraction peak corresponding to (0 0 n) of the lead bromide-based layered perovskite was observed, and a layer pitch of 4.5 nm was calculated from the diffraction peak. This value matches with the layer pitch of the $(C_{22}H45NH_3)_2PbBr_4$ layered perovskite. FIG. 4 conceptually shows the $(C_{22}H45NH_3)_2PbBr_4$ layered perovskite structure.

Example 3

Figure 5:
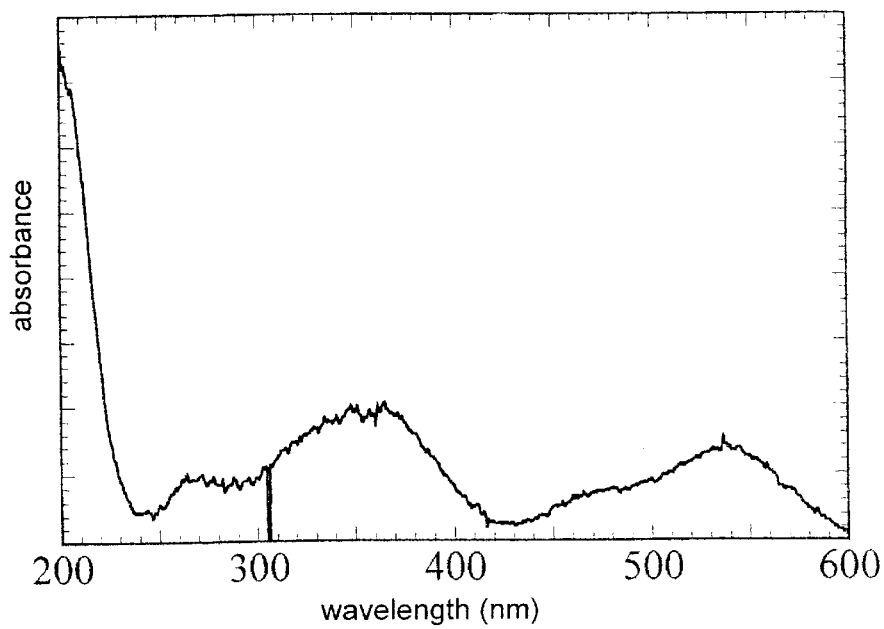
FIG. 5 is a graph showing an absorption spectrum of a layered perovskite compound thin film prepared in an example 3.

A thin film was prepared in the same manner as that of the example 2 except for using $CuBr_2$ as an inorganic halide. FIG. 5 shows an absorption spectrum of the obtained thin film. The absorption caused by d—d transition peculiar to copper bromide-based perovskite $(C_{22}H45NH_3)_2CuBr_4$ was observed in the vicinity of each wavelength of 540 nm and 360 nm. This proves that a copper bromide-based layered perovskite thin film is obtained.

Example 4

A layered perovskite compound thin film with organic layers having a functional chromophore introduced thereinto was prepared. The thin film was prepared by using an organic ammonium hydrobromide containing an azobenzene chromophore represented by the following formula (1) as the chromophore.

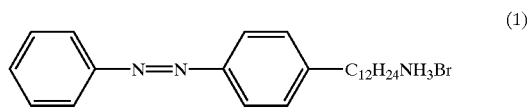

(1)

Figure 6:
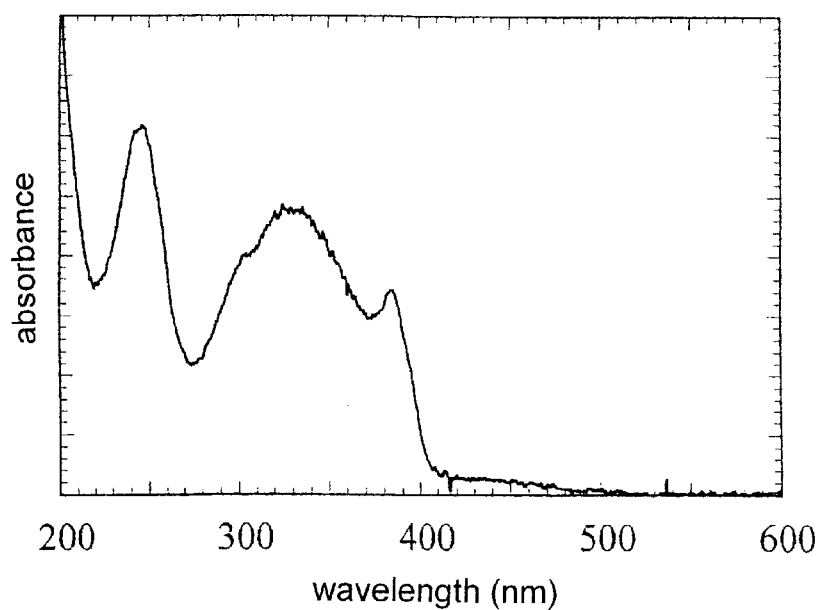
FIG. 6 is a graph showing an absorption spectrum of a layered perovskite compound thin film prepared in an example 4.

For preparing the thin film, the organic ammonium hydrobromide containing the azobenzene chromophore was used as a substitute for the dococylamine hydrobromide used in the examples 1 and 2. FIG. 6 shows an absorption spectrum of the thin film prepared by using the organic ammonium hydrobromide containing the azobenzene chromophore.

In case of using the azobenzene chromophore, the absorption peculiar to H-aggregation of the azobenzene chromophore was observed in the vicinity of 330 nm in addition of the exciton absorption of the lead bromide-based layered perovskite compound around 390 nm. From this spectrum, it was verified that a lead bromide-based layered perovskite compound thin film with organic layers having the azobenzene chromophore introduced thereinto was formed by using the organic ammonium hydrobromide containing the azobenzene chromophore.

Example 5

A salicyliden aniline chromophore represented by the following formula (2) was used as a substitute for the azobenzene chromophore in the example 4.

(2)

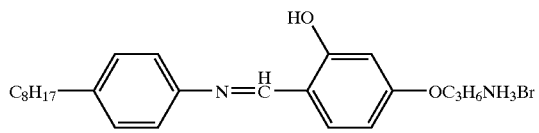

Figure 7:
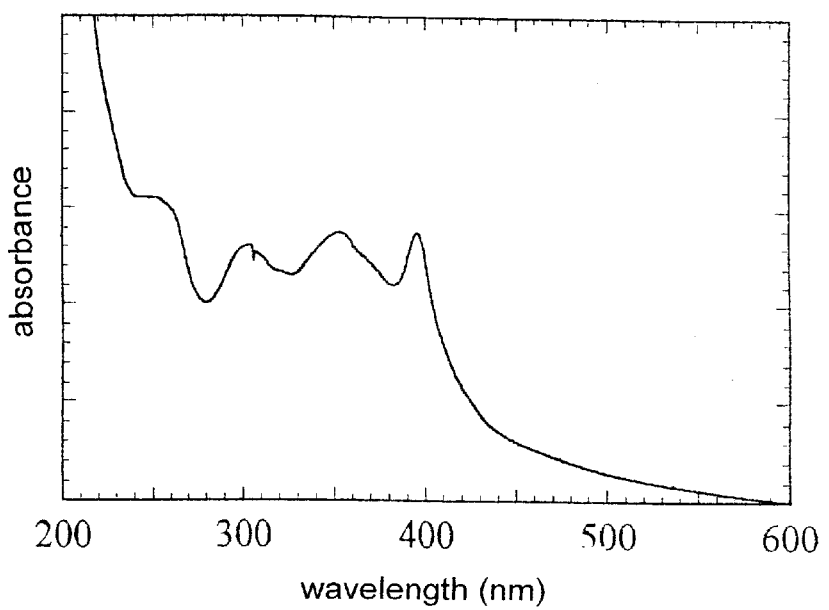
FIG. 7 is a graph showing an absorption spectrum of a layered perovskite compound thin film prepared in an example 5.

As shown in FIG. 7, in case of using the salicyliden aniline chromophore, the absorption peculiar to the salicyliden aniline chromophore was observed in the vicinity of each wavelength of 300 nm and 350 nm in addition of the exciton absorption of the lead bromide-based layered perovskite compound around 390 nm. From this spectrum, it was verified that a lead bromide-based layered perovskite compound thin film with organic layers having the salicyliden aniline chromophore introduced thereinto was formed.

Example 6

Figure 8:
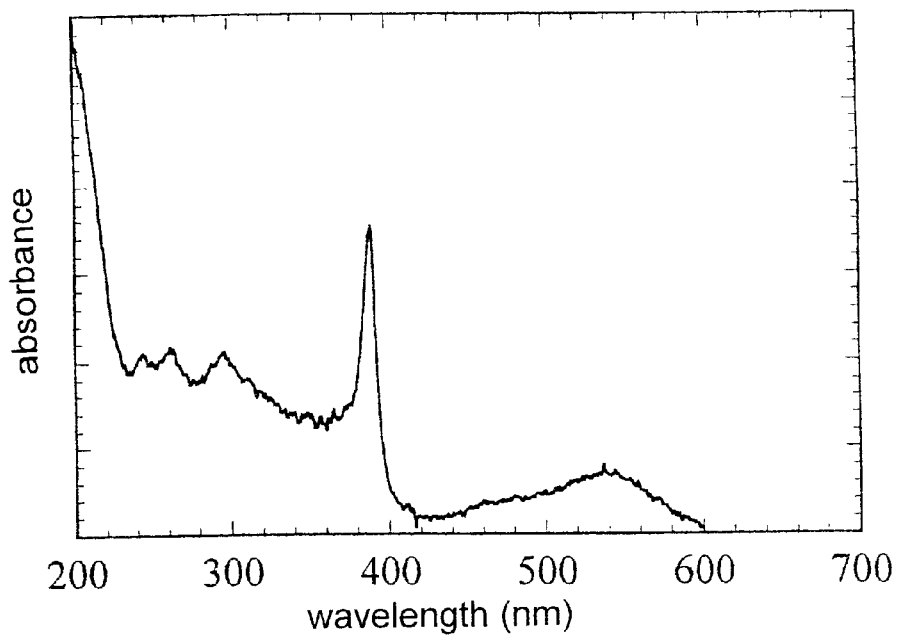
FIG. 8 is a graph showing an absorption spectrum of a layered perovskite compound thin film in which monomolecular films prepared in an example 6 are superimposed on a one by one basis.
Figure 9:
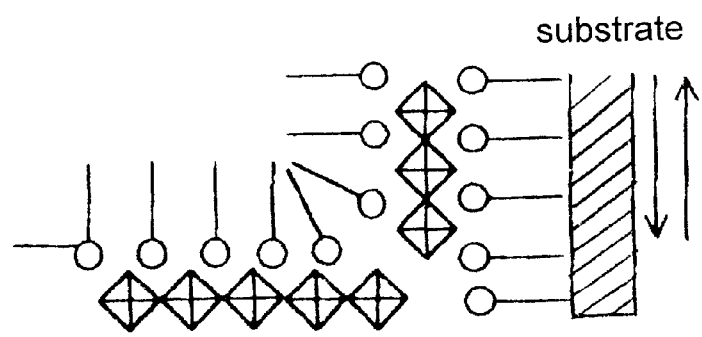
FIG. 9 an explanatory schematic diagram showing one embodiment for transferring a monomolecular film onto a substrate by using the Langmuir-Blodgett method.
Figure 10:
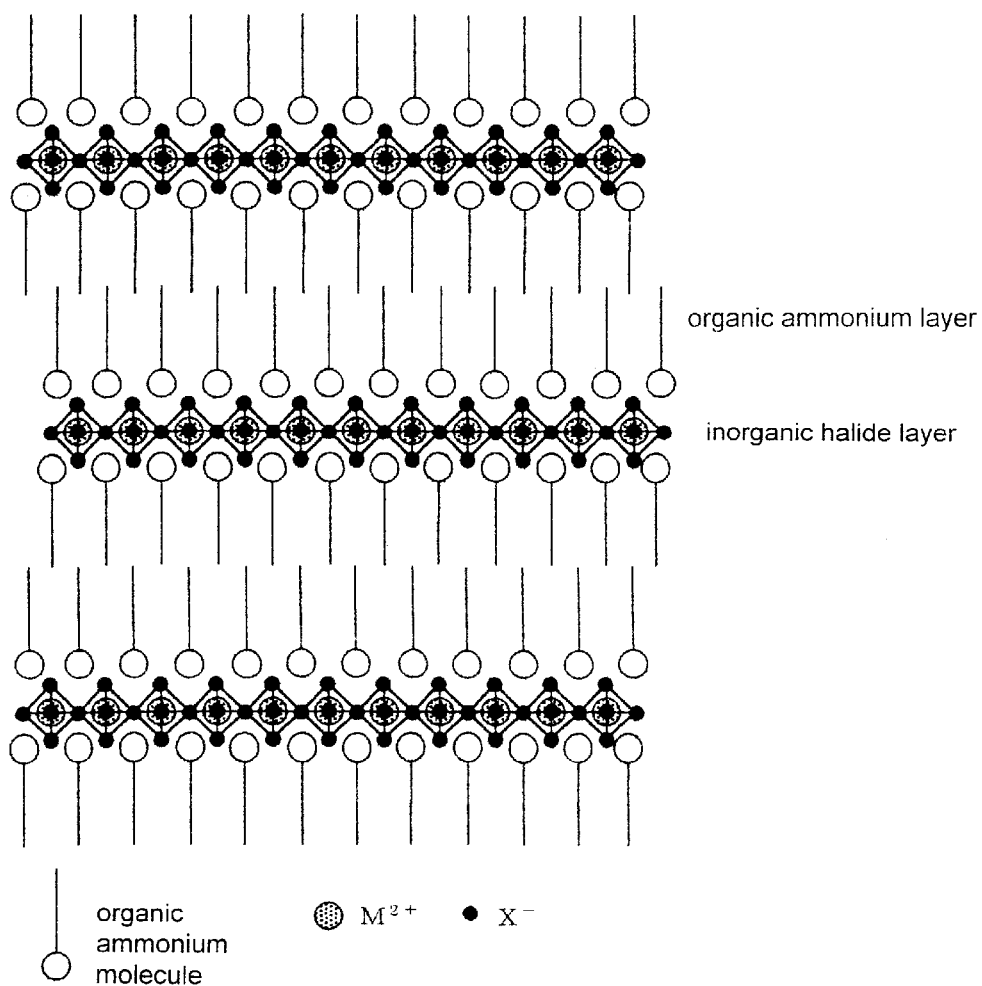
FIG. 10 is a schematic diagram of a superlattice structure of an organic ammonium-containing inorganic layered perovskite compound.

In this example, a layered perovskite thin film as a monomolecular-order layer is combinedly stacked on a one by one basis. A composite film was prepared by using $PbBr_2$ and $CuBr_2$ separately as an inorganic halide for each layered perovskite compound monomolecular film and stacking the monomolecular film on a one by one basis according to each process of the examples 2 and 3. FIG. 8 shows an absorption spectrum of the prepared thin film.

The exciton absorption of the lead bromide-based layered perovskite compound and the d—d transition-derived absorption of the copper bromide-based layered perovskite compound are observed in the vicinity of 390 nm and 540 nm, respectively. It is proved that this absorption spectrum is formed by superimposing respective absorption spectrums of the above two kinds of layered perovskite compound monomolecular films.

INDUSTRIAL APPLICABILITY

As described above, the method of the present invention can prepare the following novel functional compound thin films.

(1) A layered perovskite thin film having a film thickness controllable at the level of a monomolecular layer.

(2) A layered perovskite thin film with having organic layers having a functional chromophore introduced therein prepared by using an organic amine hydrohalic acid salt containing a functional chromophore.

(3) A composite thin film composed of combined layered perovskite compound monomolecular films each having different organic or inorganic layers prepared by stacking such monomolecular films on a one by one basis.

What is claimed is:

1. A method for preparing a layered perovskite compound thin film with organic ammonium layers and inorganic layers, said layered perovskite compound thin film having a superlattice structure represented by the general formula $A_2MX_4$, where A is an organic ammonium molecule, M is a group 4 element or transition metal and X is halogen (Cl, Br, I), and in which a layer of organic ammonium molecule A and a layer of inorganic halide $MX_4$ are alternately stacked, wherein an organic solvent solution having dissolved therein an organic ammonium molecule or a mixture of an organic ammonium molecule and an inorganic halide is dropped onto to the surface of a water solution having dissolved therein a water-soluble organic ammonium molecular and an inorganic halide to form a monomolecular film of an organic amine hydrohalic acid salt having a long-chain alkyl group and simultaneously to react said formed monomolecular film with said inorganic halide in said water solution so as to form a monomolecular film of a layered perovskite with organic ammonium layers and inorganic layers on the surface of said water solution, and then said formed monomolecular film is transferred onto a substrate by using the Langmuir-Blodgett method.

2. A method for preparing a layered perovskite compound thin film with organic ammonium layers and inorganic layers as defined in claim 1, wherein said organic ammonium molecule to be dissolved in said water solution is a water-soluble alkylamine hydrohalic acid salt $C_nH_{2n+1}NH_3X$, and said organic ammonium molecule to be dissolved in said organic solvent solution contains a non-water-soluble alkylamine hydrohalic acid salt $C_nH_{2n+1}NH_3X$.

3. A method for preparing a layered perovskite compound thin film with organic ammonium layers and inorganic layers as defined in claim 2, wherein said non-water-soluble alkylamine hydrohalic acid salt $C_nH_{2n+1}NH_3X$ to be dissolved in said organic solvent solution is a docoylamine hydrohalic acid salt $C_{22}H_{45}NH_3X$.

4. A method for preparing a layered perovskite compound thin film with organic ammonium layers and inorganic layers as defined in either one of claims 1 to 3, wherein said organic solvent is chloroform or a mixture of chloroform and dimethylformamide.

5. A method for preparing a layered perovskite compound thin film with organic ammonium layers and inorganic layers as defined in claim 1, wherein said organic ammonium molecule A is an organic ammonium containing a functional chromophore.

6. A method for preparing a layered perovskite compound thin film with organic ammonium layers and inorganic layers as defined in claim 5, wherein said organic ammonium molecule to be dissolved in said organic solvent is an organic ammonium containing a non-water-soluble functional chromophore.

7. A method for preparing a layered perovskite compound thin film with organic ammonium layers and inorganic layers as defined in claim 5 or 6, wherein said functional chromophore is azobenzene chromophore or salicyliden aniline chromophore.

8. A method for a layered perovskite compound thin film with organic ammonium layers and inorganic layers as defined in claim 1, wherein a plurality of layered perovskite compound thin films are prepared by the method, wherein at least two of said layered perovskite compound thin films are different in at least either one of the kinds of said inorganic layer and organic ammonium layer, and wherein said formed layered perovskite compound thin films are combinedly stacked in increments of a monomolecular layer.

9. A layered perovskite compound thin film with organic ammonium layers and inorganic layers prepared by the method as defined in claim 1, said layered perovskite compound thin film having a superlattice structure represented by the general formula $A_2MX_4$, where A is an organic ammonium molecule, M is a group 4 element or transition metal and X is halogen (Cl, Br, I), and in which a layer of organic ammonium molecule A and a layer of inorganic halide $MX_4$ are superimposed alternately, wherein said organic ammonium molecule A is an organic ammonium containing a functional chromophore.

10. A layered perovskite compound thin film with organic ammonium layers and inorganic layers as defined in claim 9, wherein said functional chromophore is azobenzene chromophore or salicyliden aniline chromophore.

11. A layered perovskite compound thin film with organic ammonium layers and inorganic layers as defined in claim 9 or 10, wherein said inorganic halide is $PbBr_2$ or $CuBr_2$.

* * * * *